(12) United States Patent
Bandarapu et al.

(10) Patent No.: US 12,198,945 B2
(45) Date of Patent: Jan. 14, 2025

(54) VAPOR DELIVERY HEAD FOR PREVENTING STICTION OF HIGH ASPECT RATIO STRUCTURES AND/OR REPAIRING HIGH ASPECT RATIO STRUCTURES

(71) Applicant: LAM RESEARCH AG, Villach (AT)

(72) Inventors: Bhaskar Bandarapu, Villach (AT); David Mui, Fremont, CA (US); Karl-Heinz Hohenwarter, Dellach/Gail (AT); Butch Berney, Pleasanton, CA (US); Nathan Lavdovsky, Beaverton, OR (US); Christian Putzi, Rosenbach (AT); Hongbo Si, Santa Clara, CA (US); Robert Johnson, San Jose, CA (US); Michael Klemm, Villach (AT); Bernhard Loidl, Villach (AT)

(73) Assignee: LAM RESEARCH AG, Villach (AT)

( * ) Notice: Subject to any disclaimer, the term of this patent is extended or adjusted under 35 U.S.C. 154(b) by 881 days.

(21) Appl. No.: 17/269,609

(22) PCT Filed: Aug. 21, 2019

(86) PCT No.: PCT/US2019/047458
§ 371 (c)(1),
(2) Date: Feb. 19, 2021

(87) PCT Pub. No.: WO2020/041441
PCT Pub. Date: Feb. 27, 2020

(65) Prior Publication Data
US 2021/0366738 A1 Nov. 25, 2021

Related U.S. Application Data

(60) Provisional application No. 62/721,710, filed on Aug. 23, 2018.

(51) Int. Cl.
*H01L 21/67* (2006.01)
*H01L 21/687* (2006.01)

(52) U.S. Cl.
CPC .. *H01L 21/67051* (2013.01); *H01L 21/67069* (2013.01); *H01L 21/67103* (2013.01); *H01L 21/67253* (2013.01); *H01L 21/687* (2013.01)

(58) Field of Classification Search
None
See application file for complete search history.

(56) References Cited

U.S. PATENT DOCUMENTS 6,485,531 B1 11/2002 Schob
6,507,031 B1 * 1/2003 Jinbo ................ H01L 21/02046
134/1

(Continued)

FOREIGN PATENT DOCUMENTS

JP 2009-124061 A 6/2009
KR 2007-0004866 A 1/2007

(Continued)

OTHER PUBLICATIONS

Machine translation; KR20130035039; Lee et al. (Year: 2013).*

(Continued)

*Primary Examiner* — Natasha N Campbell

(57) ABSTRACT

A vapor delivery head for wet treatment of a substrate includes a body including an upper surface, a lower surface, an upper plenum and a lower plenum. A first bore is arranged on the upper surface of the body and fluidly connected to the upper plenum to supply heated fluid. A second bore is arranged on the upper surface of the body and connected to the upper plenum to remove heated fluid. A third bore is arranged on the upper surface of the body and connected to the lower plenum to receive a gas mixture. A plurality of (Continued)

through holes through the lower surface of the body are in fluid communication with the lower plenum.

18 Claims, 13 Drawing Sheets

(56) References Cited

U.S. PATENT DOCUMENTS

| | | | |
|---|---|---|---|
| 2007/0072414 A1* | 3/2007 | Suzuki | C23C 16/045 438/650 |
| 2007/0238028 A1 | 10/2007 | Inatomi | |
| 2009/0128787 A1 | 5/2009 | Yamamoto et al. | |
| 2009/0135384 A1 | 5/2009 | Yamamoto et al. | |
| 2011/0155181 A1 | 6/2011 | Inatomi | |
| 2018/0047593 A1 | 2/2018 | Mui et al. | |
| 2018/0076018 A1 | 3/2018 | Otsuji | |

FOREIGN PATENT DOCUMENTS

| | | |
|---|---|---|
| KR | 2009-0053724 A | 5/2009 |
| KR | 1020110077705 A | 7/2011 |
| KR | 2013-0035039 A | 4/2013 |
| KR | 1020130035039 A | 4/2013 |
| KR | 1020140132601 A | 11/2014 |
| KR | 2018-0029914 A | 3/2018 |
| TW | 201137934 A | 11/2011 |
| TW | 201816833 A | 5/2018 |
| WO | WO-2019083735 A1 | 5/2019 |

OTHER PUBLICATIONS

International Search Report and Written Opinion of the ISA issued in PCT/US2019/047458, mailed Dec. 10, 2019; ISA/KR.
Final Office Action from corresponding Korean Application No. 10-2021-7008513, dated Oct. 5, 2023.
Translation of the First Office Action corresponding to Korean Application No. 10-2021-7008513 dated Oct. 11, 2022, 9 pages.
Translation of the First Office Action corresponding to Taiwanese Application No. 108129410 dated Oct. 12, 2022, 9 pages.
First Office Action from corresponding Chinese Patent Application No. 201980055386.7, dated Jun. 29, 2024.

* cited by examiner

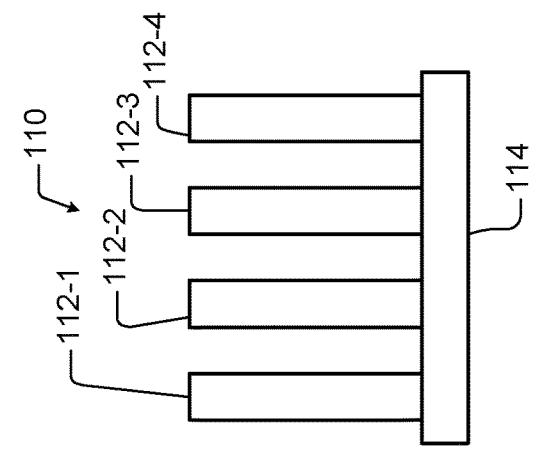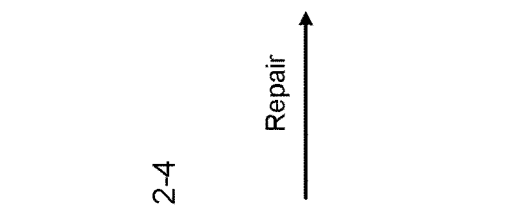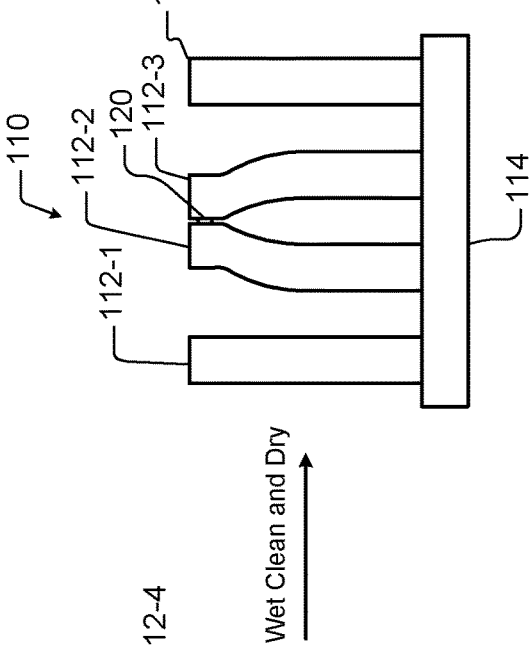

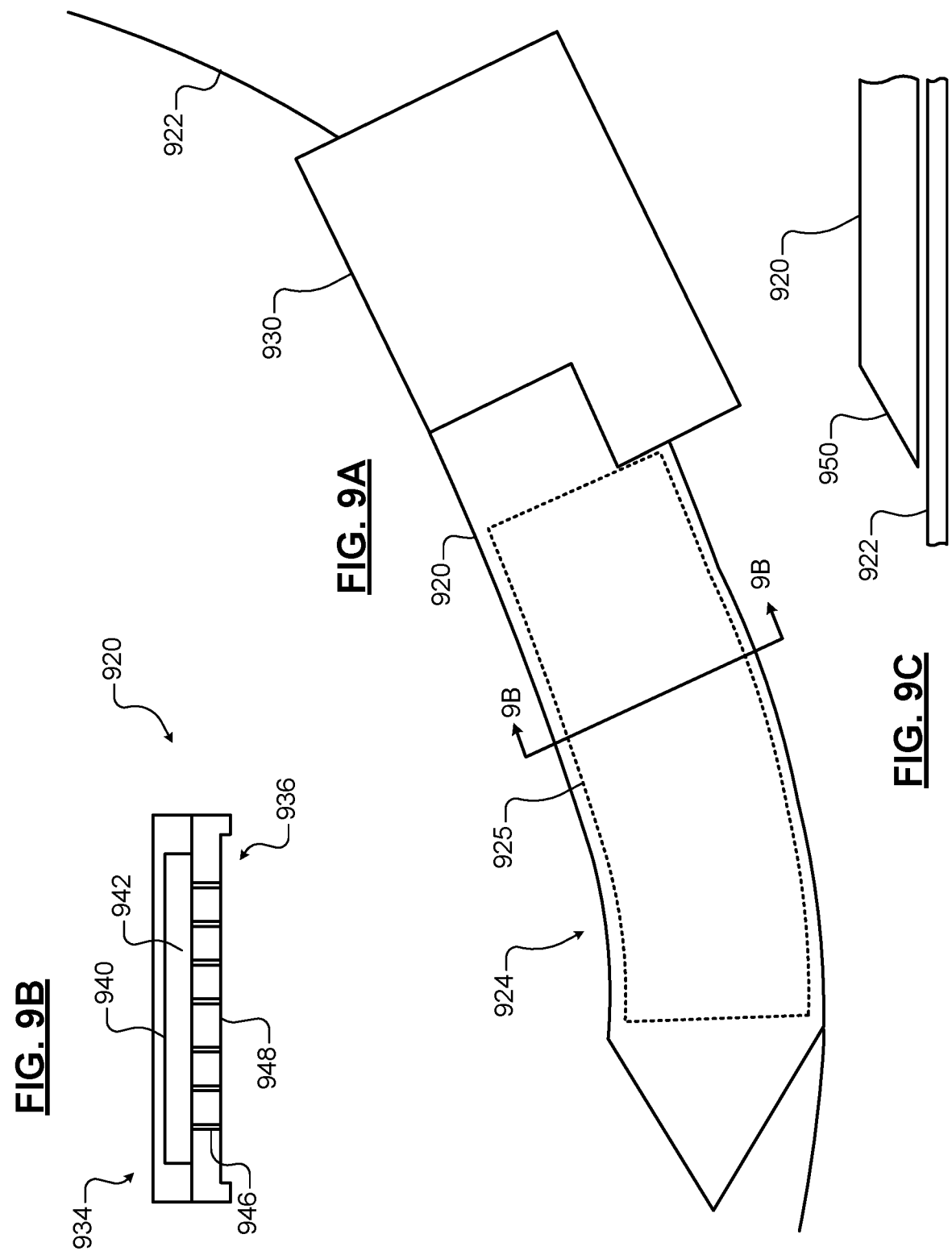

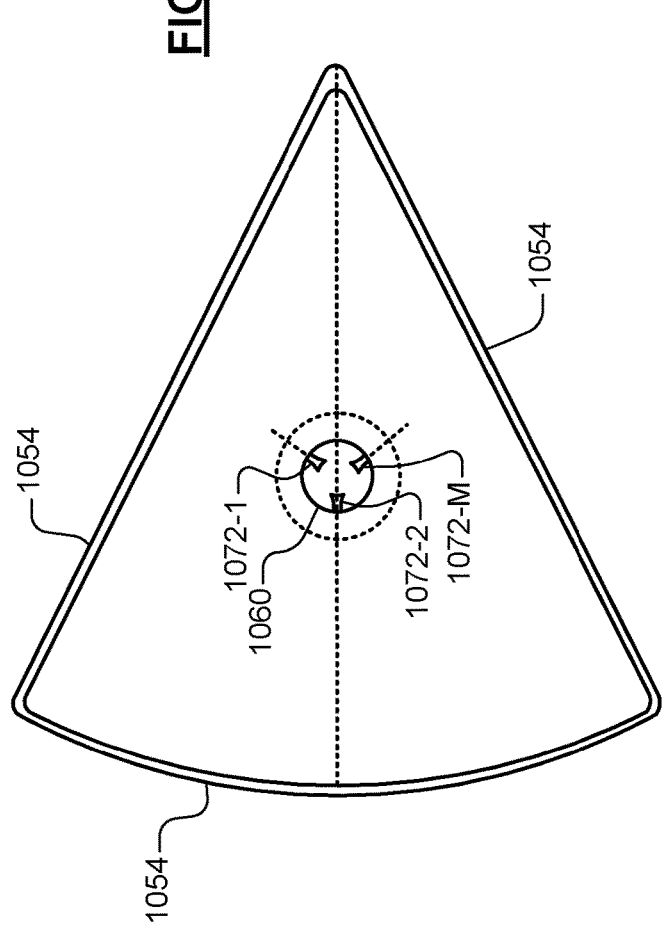
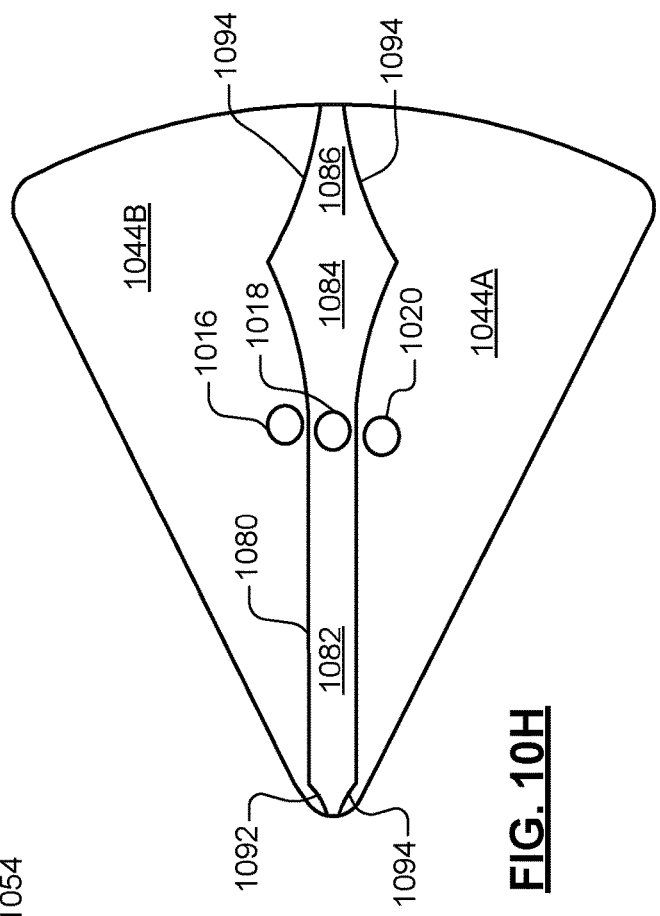
FIG. 10G
FIG. 10H

VAPOR DELIVERY HEAD FOR PREVENTING STICTION OF HIGH ASPECT RATIO STRUCTURES AND/OR REPAIRING HIGH ASPECT RATIO STRUCTURES

CROSS-REFERENCE TO RELATED APPLICATIONS

This application is a U.S. National Phase Application under 35 U.S.C. 371 of International Application No. PCT/US2019/047458, filed on Aug. 21, 2019, which claims the benefit of U.S. Provisional Application No. 62/721,710, filed on Aug. 23, 2018. The entire disclosures of the applications referenced above are incorporated herein by reference.

FIELD

The present disclosure relates to processing of substrates, and more particularly to preventing stiction of high aspect ratio (HAR) structures and/or repairing HAR structures.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit film on a substrate such as semiconductor wafer or to etch, clean and/or otherwise treat the surface of the substrate. In some processes, the substrates may be subjected to wet processing. In these processes, the substrate may be mounted on a rotary chuck. As the rotary chuck is rotated, fluid nozzles may be used to dispense fluid such as a liquid or gas and/or heat may be applied to treat the substrate.

Some of the substrates include high aspect ratio (HAR) structures. For example, the HAR structures may include nanopillars, trenches or vias. The HAR structures have a width (parallel to a surface of the substrate) that is significantly less than a depth (perpendicular to a surface of the substrate) of the feature. HAR structures having an aspect ratio greater than 5:1 are fairly common. More advanced processes include HAR structures having even higher aspect ratios. Pattern collapse occurs when one or more of the HAR structures collapse, move laterally relative to a surface of the substrate and/or directly contact adjacent HAR structures. Pattern collapse is often encountered during drying after a wet clean process Several processes have been used to reduce pattern collapse when drying substrates. For example, the substrate can be dried using supercritical $CO_2$. However, supercritical $CO_2$ is relatively expensive and has implementation issues. The surface of the substrate can be modified with a layer to prevent stiction. However, surface modification is often expensive since it requires extra chemistries to be used. Surface modification also leads to material loss since the modified layer needs to be removed. The substrate can also be dried using isopropyl alcohol (IPA) that is delivered to the surface of the substrate at a temperature close to the boiling point of IPA. However, some aspect ratios cannot be dried using boiling IPA without pattern collapse.

The substrate can also be treated using hydrofluoric (HF) vapor etching in vacuum equipment operated at vacuum pressures. However, the vacuum equipment is typically expensive and cannot be used to perform wet cleaning. The preceding wet clean step is often necessary to remove organic or metal contaminants from the surface of the substrate.

Repairing collapsed structures can be performed using plasma etching in vacuum equipment. However, the plasma etching hardware that is required is expensive.

SUMMARY

A vapor delivery head for wet treatment of a substrate includes a body including an upper surface, a lower surface, an upper plenum and a lower plenum. A first bore is arranged on the upper surface of the body and fluidly connected to the upper plenum to supply heated fluid. A second bore is arranged on the upper surface of the body and connected to the upper plenum to remove heated fluid. A third bore is arranged on the upper surface of the body and connected to the lower plenum to receive a gas mixture. A plurality of through holes through the lower surface of the body are in fluid communication with the lower plenum.

In other features, the body includes a first side, a second side and a third side, wherein the body has a pie shape. An angle is defined between the first side and the second side is in a range from 30° to 75°. An angle defined between the first side and the second side is in a range from 45° to 60°. A radius of the body is greater than 80% of a radius of the substrate.

In other features, the body further defines an outer plenum arranged below the upper plenum and outside of the lower plenum. The upper plenum includes a first upper plenum, a second upper plenum and a divider arranged between the first upper plenum and the second upper plenum. An outer plenum is located below the upper plenum and outside of the lower plenum.

In other features, the heated fluid flows into the first bore, into the first upper plenum, into the outer plenum, into the second upper plenum and out through the second bore. The heated fluid includes a heated gas.

In other features, a baffle is arranged in the lower plenum between the third bore and the lower plenum. The baffle includes a plurality of baffle portions to distribute the gas mixture in the lower plenum.

In other features, a baffle is arranged in the lower plenum between the third bore and the lower plenum and includes a plurality of baffle portions that are arranged around an opening into the lower plenum to distribute more of the gas mixture to an area adjacent to the third side as compared to the gas mixture delivered to an area adjacent to a junction of the first side and the second side.

In other features, the plurality of baffle portions includes a first baffle portion, a second baffle portion, and a third baffle portion. The first baffle portion, the second baffle portion and the third baffle portion are arranged 120° apart around the opening into the lower plenum. The first baffle portion is located on a radial line of the body closest to the third side.

In other features, the plurality of through holes are arranged in an area on the lower surface that is triangular.

A device for wet treatment of a substrate includes a chuck to hold the substrate and to rotate the substrate and the vapor delivery head. The lower surface of the body is arranged parallel to the substrate during treatment.

A method includes using the device to direct the gas mixture containing hydrogen fluoride over an upper surface of the substrate.

In other features, prior to using the device to direct the gas mixture over a surface of the substrate, the method includes spin rinsing the surface of the substrate using a first rinsing liquid and spinning off the first rinsing liquid from the surface of the substrate.

In other features, the hydrogen fluoride is a first reactive component and the gas mixture further contains a second reactive component. At least one of the second reactive component is a proton acceptor and/or the second reactive component includes an OH-group. The second reactive component is selected from a group consisting of water vapor, alcohol vapor, ammonia and amine.

A device for wet treatment of a substrate includes a chuck to hold the substrate and to rotate the substrate. An arm is moveable relative to the chuck. A vapor delivery head is connected to the arm and includes a body. A first fluid passage delivers a gas mixture through the body. A vapor containment cavity is located on a substrate-facing surface of the body. A nozzle is located in the vapor containment cavity and is fluidly connected to the first fluid passage.

In other features, the vapor containment cavity increases a residence time of the gas mixture adjacent to the substrate. The gas mixture includes hydrogen fluoride. Alternately, the gas mixture includes hydrogen fluoride, an inert gas, and alcohol. The nozzle has a circular cross-section or is a slit-shaped nozzle. The vapor delivery head includes a plurality of nozzles.

In other features, the vapor containment cavity has a depth in a range of 0.2 mm to 20 mm. Alternately, the vapor containment cavity has a depth in a range of 0.3 mm to 10 mm or 1 mm to 6 mm. The body defines a plenum to receive the gas mixture. The body further comprises a first portion including the first fluid passage and a second portion. The plenum is defined between the first portion and the second portion and is in fluid communication with the first fluid passage of the first portion.

In other features, the nozzle passes through the second portion. A heater is arranged in the body of the vapor delivery head. The heater can include a resistive heater or a fluid passage to receive heated fluid. The heater heats the vapor delivery head to a temperature in a range from 50° C. to 200° C. or in a range from 50° C. to 100° C.

The vapor containment cavity defines an area that is 0.1% to 30% of an area of the substrate. In some examples, the vapor containment cavity defines an area that is 1% to 15% of an area of the substrate. The plurality of through holes are arranged in a portion of the area of the vapor containment cavity that is located adjacent to a leading edge of the vapor delivery head. The portion of the area of the vapor containment cavity is less than 50% of the area of the vapor containment cavity. A seal is located between the first portion and the second portion.

In other features, the second portion includes a downwardly projecting flange located on a substrate-facing surface thereof. An inner surface of the downwardly projecting flange defines an outer boundary of the vapor containment cavity.

In other features, the first portion further defines a second fluid passage. The plenum is in fluid communication with the second fluid passage. The vapor delivery head has a rectangular-shaped cross section or a banana-shaped cross section in a plane parallel to the substrate.

In other features, a liquid nozzle head is connected to a second arm and delivers rinsing liquid onto the substrate and a motor scans the second arm with the liquid nozzle head across the substrate. Alternately, a liquid nozzle head connected to the arm delivers rinsing liquid onto the substrate and a motor scans the arm with the liquid nozzle head and the vapor delivery head across the substrate.

In other features, the arm is configured to sweep the vapor delivery head across the substrate with the vapor containment cavity located at a predetermined distance from the substrate. The predetermined distance is in a range from greater than or equal to 0.1 mm to less than or equal to 10 mm. In some examples, the predetermined distance is in a range from 1 mm to 3 mm.

A method includes using the device to direct a gas mixture containing hydrogen fluoride over the surface of the substrate. Prior to using the device to direct the gas mixture over the surface of the substrate, the method includes spin rinsing the surface of the substrate using a first rinsing liquid and spinning off the first rinsing liquid from the surface of the substrate.

In other features, the hydrogen fluoride is a first reactive component and the gas mixture further contains a second reactive component. The second reactive component is a proton acceptor and/or the second reactive component includes an OH-group. The second reactive component is selected from a group consisting of water vapor, alcohol vapor, ammonia and amine.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 1A-1C are side cross-sectional views illustrating a substrate before and after wet cleaning and drying and after repair according to the present disclosure;

FIG. 9A is a plan view of another example of a curved vapor delivery head according to the present disclosure;

FIG. 9B is a side cross-sectional view of the curved vapor delivery head of FIG. 9A; and FIG. 9C is a side view of the curved vapor delivery head of FIG. 9A;

FIG. 10G is a plan cross-sectional view of the vapor delivery head taken along line G-G in FIG. 10F according to the present disclosure; and FIG. 10H is a plan cross-sectional view of the vapor delivery head taken along line H-H in FIG. 10F according to the present disclosure.

In the drawings, reference numbers may be reused to identify similar and/or identical elements.

DETAILED DESCRIPTION

Figure 2A:
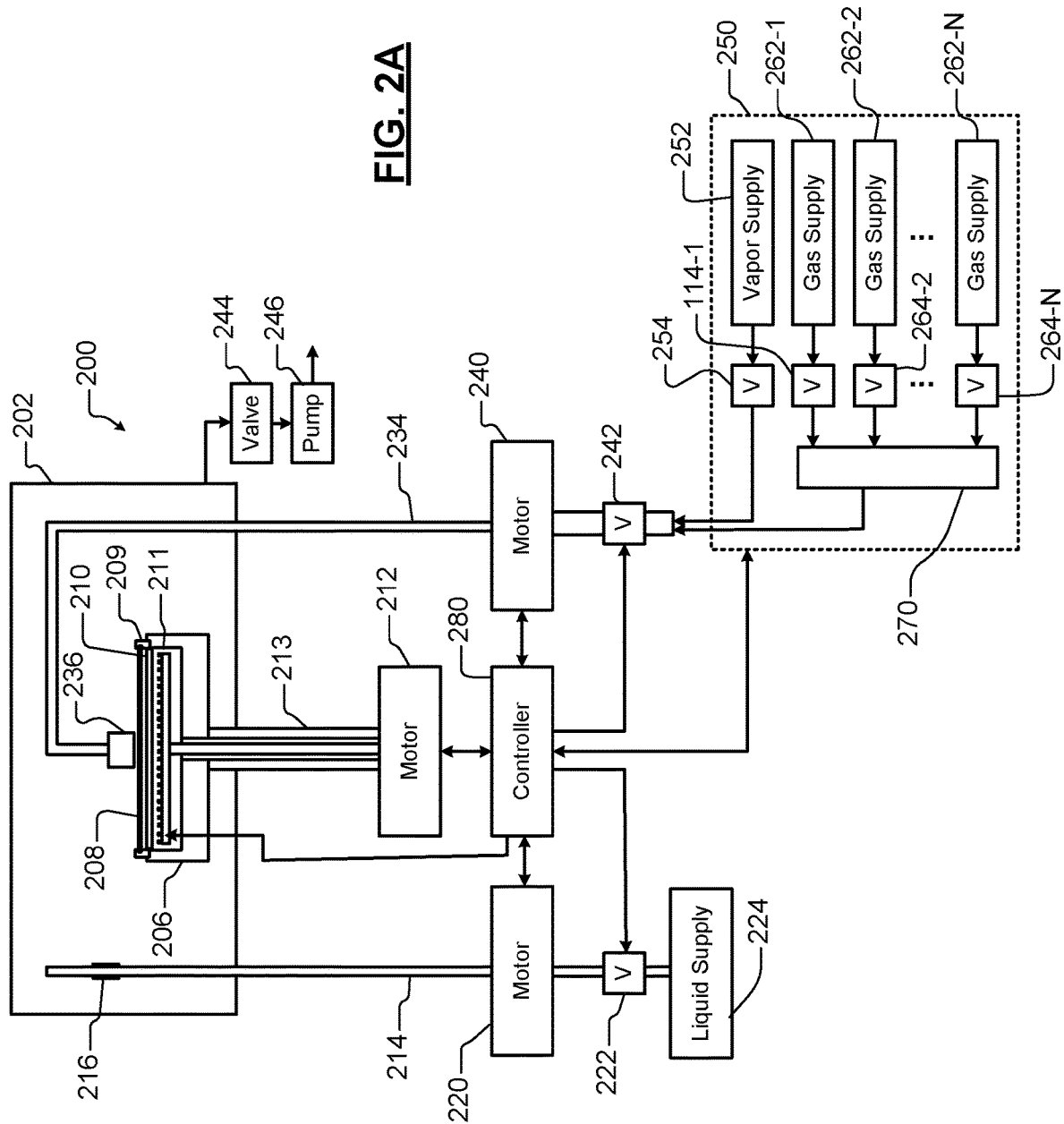
FIG. 2A is a functional block diagram of an example of a rotary chuck with a vapor delivery head for processing a substrate according to the present disclosure.

A vapor delivery head according to the present disclosure can be used after wet processing during dry etching of a substrate including high aspect ratio (HAR) structures. The vapor delivery head is arranged in close proximity to the substrate thereto (as the substrate is rotated).

In some examples, the vapor delivery head includes a body including an upper surface and a bottom surface with a plurality of through holes. The body defines first and second upper plenums, a lower plenum and an outer plenum arranged around the lower plenum. A gas mixture inlet arranged on the upper surface of the body is in fluid communication with the lower plenum. The gas mixture flows into the gas mixture inlet, into the lower plenum and out through the plurality of through holes.

Heated fluid such as heated gas flows into another inlet arranged on the upper surface of the body and into the first upper plenum. The heated fluid flows downward into the outer plenum, upward into the second upper plenum and out through an outlet arranged on the upper surface of the body. The heated fluid heats the body of the vapor delivery head to prevent condensation of the gas mixture.

In some examples, the body has a pie-shape, although other shapes can be used. In some examples, a position of the vapor delivery head is fixed relative to the substrate during treatment using the vapor (while the substrate rotates). In some examples, the vapor delivery head is removed after vapor treatment to allow other types of substrate treatments.

In other examples, the vapor delivery head includes a vapor containment cavity that increases a concentration of a gas mixture near the substrate to increase etching. The wet processing and dry etching can be performed at or near atmospheric pressure in a wet clean tool after the substrate is processed. The combination of wet processing and dry etching in a single hardware device provides a less expensive alternative to the other drying processes and adds little or no processing time. Alternately, the wet processing can be completed in a wet processing tool and the repair process can be performed in a separate repair tool.

In some examples, after exposure to a rinsing liquid such as isopropyl alcohol (IPA), a gas mixture is dispensed onto the surface of the substrate using the vapor delivery head. In some examples, the gas mixture includes a fluorine gas species such as hydrofluoric (HF) gas, although other gases or gas mixtures can be used. Additional details relating to the use of HF gas can be found in U.S. Provisional Patent Application No. 62/575,705, filed on Oct. 23, 2017. The vapor delivery head according to the present disclosure is used to increase a residence time of the gas mixture above the substrate and to reduce dilution of the gas mixture by surrounding ambient gas (as compared to systems using a standard nozzle to dispense the gas mixture).

In some examples, the gas mixture may further include a second reactive component (such as a solvent vapor or a proton acceptor or component having an OH-group) and/or a carrier gas. In some examples, the carrier gas includes molecular nitrogen ($N_2$), although other carrier gases can be used. In some examples, the second reactive component includes water or alcohol (methanol, IPA, or other alcohol). For example, an adsorbed layer of the solvent is formed and $HF_2$ is generated. $SiO_2$ reacts with $HF_2$ and $SiF_4$ is formed, which leads to evaporation (etching) of the $SiO_2$ layer.

In some examples, the gas mixture includes HF in a range from 0.5% to 5% volume, IPA in a range from 0.5% to 2.5% volume, and $N_2$ in a range from 92.5% to 99% volume. In some examples, the gas mixture is generated by flowing $N_2$ gas as a carrier gas through concentrated aqueous HF (with HF concentration in a range from 45% to 55% volume (e.g. 49% volume)).

In other examples, the gas mixture includes an inert gas in a range from 80% to 99.9% volume, HF in a range from 0.05% to 10% volume, and alcohol in a range from 0.05% to 10% volume. In other examples, the gas mixture includes an inert gas in a range from 90% to 99.8% volume, HF in a range from 0.1% to 5% volume, and alcohol in a range from 0.1% to 5% volume.

In some examples, the gas mixture is generated by flowing $N_2$ gas as a carrier gas through concentrated aqueous HF (with HF concentration in a range from 45% to 55% volume (e.g. 49% volume)).

In other examples, ammonia ($NH_3$), or any amine (e.g. ethyl amine, ethylene diamine, pyrrolidine) is optionally added to the gas mixture when the processing temperature is greater than 100° C. Addition of $NH_3$ works in particular at temperatures above 100° C. where formation of $NH_4F$ is inhibited (as it is above the sublimation temperature) and volatile $(NH_4)_2SiF_6$ is formed.

As an alternative, the process can also be applied to the substrate after the rinsing liquid has been spun off the substrate and the substrate is relatively dry. In some examples, the process can include exposure while the rinsing liquid is present and again after the rinsing liquid has been spun off and is dry. The process can be repeated one or more times.

In some examples, the process is performed at or near atmospheric pressures. For example, the substrate surface may be maintained at a pressure in a range from 900 to 1100 hectopascals (hPa) during processing. In some examples, the gas mixture is delivered to the substrate using a nozzle that is scanned across the surface of the substrate in a linear direction (such as along a radial line) or in an arcuate path. In addition, vapors that can potentially enhance the process such as water or ammonia $NH_3$ vapors (gases) or amines can be supplied.

In some examples, the process is performed at a predetermined temperature in a range from 20° C. to 400° C. In other examples, the process is performed at a predetermined temperature in a range from 50° C. to 200° C. or 50° C. to 100° C. Partial pressures of HF and solvent vapor can be varied between 1 mTorr and up to their respective saturated vapor pressures at the specific process temperature.

Adding a reactive vapor (e.g. HF/solvent vapor combination) to a drying process using the vapor delivery head provides improved results relative to other IPA drying processes. In some examples, controllability of the vapor etching is performed using a substrate heater with radial heating and/or a vapor delivery head that can be scanned in the radial direction and/or along an arcuate path over the substrate. In addition to reducing hardware and chemistry costs, the method described herein increases the yield of the process. The efficiency of the process is enhanced when the vapor delivery head is used.

Referring now to FIGS. 1A-1C, processing of a substrate is shown. In FIG. 1A, a substrate 110 is shown prior to wet processing and drying. Substrate 110 includes high aspect ratio (HAR) structures 112-1, 112-2, 112-3 and 112-4 (collectively HAR structures 112) defined on one or more underlying layers 114. For example, the HAR structures 112 include pillars, vias, trenches, and/or other features. The substrate 110 in FIG. 1A is subjected to wet processing and drying.

In FIG. 1B, the substrate 110 is shown after the wet processing and drying. The HAR structures 112-2 and 112-3 partially collapse and lean towards one another. In some examples, a bridging oxide 120 is formed between the HAR structures 112-2 and 112-3. Examples of bridging oxides that may be formed include silicon oxide ($SiO_x$), silicon oxynitride ($SiO_xN_y$), titanium oxide ($TiO_x$), etc. In FIG. 1C, the substrate 110 is shown after treatment using the methods described herein such that the bridging oxide 120 is removed and the collapsed HAR structures 112-2 and 112-3 are repaired.

Referring now to FIG. 2A, an example of a system 200 for wet processing and repairing a substrate is shown. The system 200 includes a chamber 202 housing a rotary chuck 206. A substrate 208 is arranged on a surface of the rotary chuck 206. The rotary chuck 206 rotates the substrate 208 while liquid is dispensed onto the substrate 208 and/or to spin off the liquid. The substrate 208 may be attached to the rotary chuck 206 using any suitable mechanism. For example, the substrate 208 can be attached to the rotary chuck 206 using gripping pins 209. Suitable examples of gripping pins are shown and described in commonly-assigned "Method and Apparatus for Processing Wafer-Shaped Articles", U.S. patent application Ser. No. 15/232,594.

In some examples, the surface 210 of the rotary chuck 206 is transparent and a heater 211 is arranged under the surface 210. In some examples, the heater 211 includes a plurality of light emitting diodes (LEDs) that are arranged in one or more radial zones to allow radial heating of the substrate 210. In some examples, the heater 211 can be operated to provide a moving heat wave that moves from a central location of the substrate outwardly to a radially outer edge thereof. In some examples, the rotary chuck 206 rotates and the heater 211 is stationary. Suitable examples of a rotary chuck performing radial heating of the substrate are shown and described in U.S. patent application Ser. No. 15/232,594.

In some examples, the rotary chuck 206 is rotated by a motor 212 via a drive shaft 213 as shown. In other examples, the motor 212 includes a rotor and stator and the rotor is driven magnetically without physical contact. Suitable examples are shown in commonly-assigned U.S. Pat. No. 6,485,531. Rinsing liquid is delivered by an arm 214 (shown in an inactive position) and a nozzle 216 that are scanned across the substrate 208 by a motor 220. The motor 220 scans the arm across the rotating substrate in a radial direction or arcuate direction. A valve 222 selectively supplies the rinsing liquid from a liquid supply 224.

Another arm 234 (shown in an active position in FIG. 2A) and a vapor delivery head 236 may be used to deliver a gas mixture. In some examples, the gas mixture includes one or more of hydrofluoric (HF) gas, carrier gas, and/or second reactive component (e.g. solvent vapor and/or ammonia ($NH_3$)) as will be described further below. In some examples, a vapor containment cavity of the vapor delivery head 236 is arranged within a predetermined distance of a surface of the substrate 208 during etching. In some examples, the predetermined distance is in a range from greater than or equal to 0.1 mm to less than or equal to 10 mm. In other examples, the predetermined distance is in a range that is greater than or equal to 0.1 mm and less than or equal to 3 mm. In other examples, the predetermined distance is in a range from 1 mm to 3 mm. In some examples, the predetermined distance is 2 mm+/−0.5 mm. In some examples, the gas mixture is delivered at a predetermined velocity in a range from 1 to 50 m/s. In some examples, the gas mixture is delivered at a predetermined flow in a range from 1 to 20 standard liters per minute (slm).

A motor 240 may be used to scan the vapor delivery head 236 across the substrate 208 and a valve 242 may be used to selectively supply the gas mixture. A gas delivery system 250 includes a vapor supply 252 and a valve 254. In some examples, the vapor supply 252 includes a heated liquid ampoule, bubbler or other vaporizer. The gas delivery system 250 further includes one or more gas supplies 262-1, 262-2, . . . , and 262-N (collectively gas supplies 262) and valves 264-1, 264-2, . . . , and 264-N (collectively valves 264). A manifold 270 may be used to allow the gases to mix prior to delivery via the valve 242. In some examples, mass flow controllers (not shown) and/or secondary valves are provided to more precisely control the gases and/or solvent vapor. A controller 280 controls the valves, the motors and the gas delivery system 250.

Figure 2B:
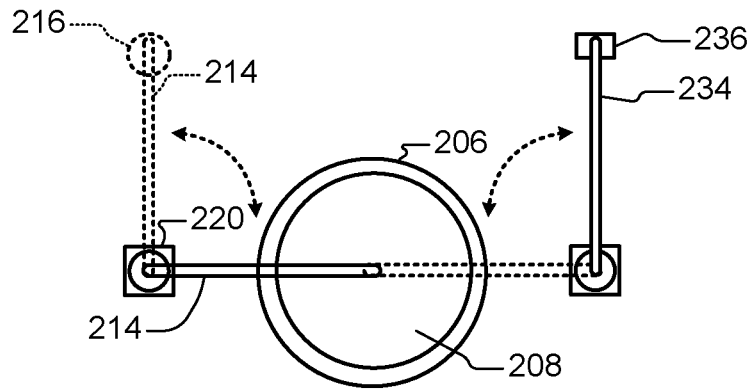
FIG. 2B is a plan view of the rotary chuck of FIG. 2A.

In FIG. 2B, the arms 214 and 234 are shown in plan view. The arm 214 is shown in a dispensing position over the substrate 208 while the arm 234 is shown in an inactive position. The arm 214 dispenses the rinsing liquid onto the substrate and the rinsing liquid is spun off. After dispensing the rinsing liquid, the arm 214 is moved to the inactive position and the arm 234 dispenses the gas mixture using the vapor delivery head 236 as will be described further below.

Figure 2C:
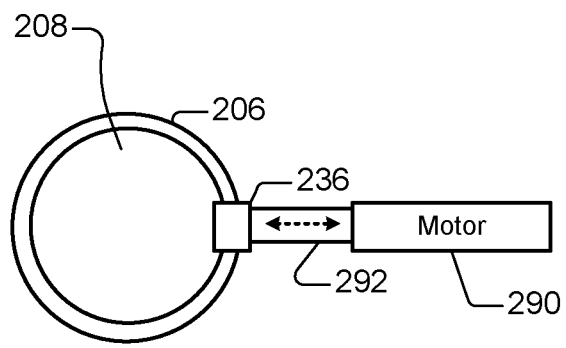
FIG. 2C is a plan view of an alternate example of the rotary chuck with an arm that sweeps the substrate in a radial direction according to the present disclosure.

In FIGS. 2A and 2B, the vapor delivery head 236 is moved across the substrate in an arcuate path. In FIG. 2C, the vapor delivery head 236 can be moved by a motor 290 and an arm 292 in a linear direction such as along a radial line or another line across of the substrate 208.

Figure 2D:
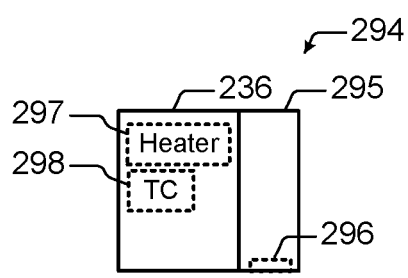
FIGS. 2D and 2E are side views of examples of combined heads including a vapor delivery head and a nozzle head according to the present disclosure.

In FIG. 2D, a combined head 294 includes the vapor delivery head 236 and a nozzle head 295. The nozzle head 295 includes one or more nozzles 296 to deliver gas and/or liquid onto the substrate. For example, the one or more nozzles 296 may be used to deliver gas such as molecular nitrogen ($N_2$), isopropyl alcohol (IPA) and/or deionized water (DIW). As can be appreciated, this arrangement requires a single arm rather than the two arms shown in FIGS. 2A and 2B.

In some examples, the vapor delivery head 236 includes a heater 297 to control a temperature thereof. In some examples, the heater 297 includes a resistive heater. A temperature sensor 298 such as a thermocouple may be used to sense a temperature of the vapor delivery head 236. The controller 280 monitors the temperature sensor 298 and adjusts operation of the heater to provide a desired temperature. In other examples, the heater 297 includes a temperature coefficient of resistance (TCR) heater, which has a resistance that is related to a temperature thereof. If the TCR heater is used, the controller 280 monitors voltage and/or current supplied to the TCR heater to determine the resistance and varies the voltage and current to provide a desired resistance corresponding to a desired temperature.

Figure 2E:
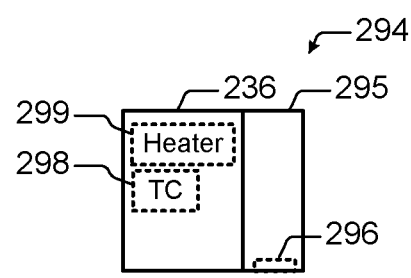

Referring now to FIG. 2E, the vapor delivery head 236 includes a heater 299 that receives a heated fluid such as a heated gas or heated liquid from a fluid source (not shown). Non-limiting examples of suitable fluids include heater molecular nitrogen ($N_2$), heated coolant, heated water, etc. A pump (not shown) may be used to flow the fluid through a passage formed in a portion of the vapor delivery head 236.

Figure 4:
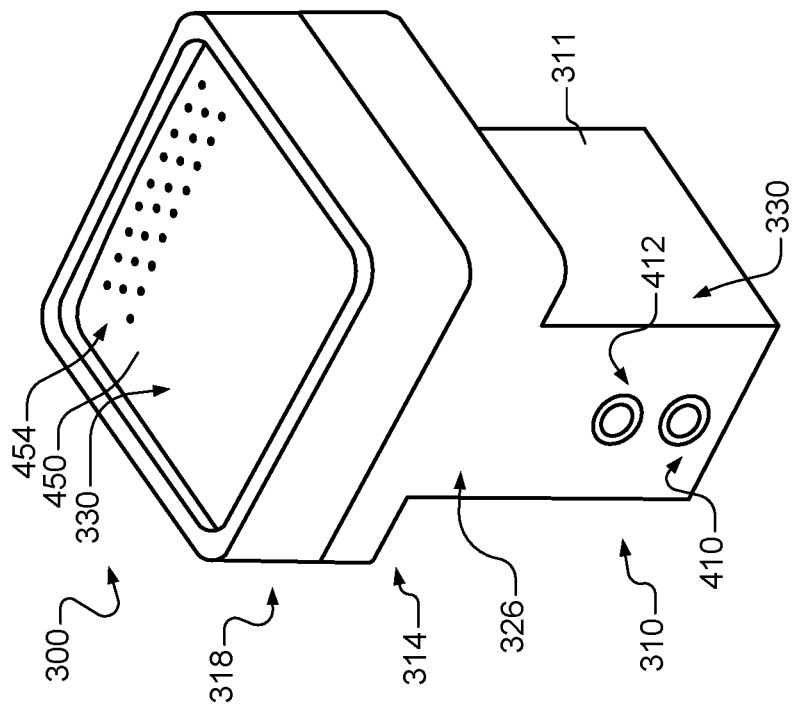
FIGS. 3 and 4 are top and bottom perspective views of an example of a vapor delivery head according to the present disclosure.
Figure 3:
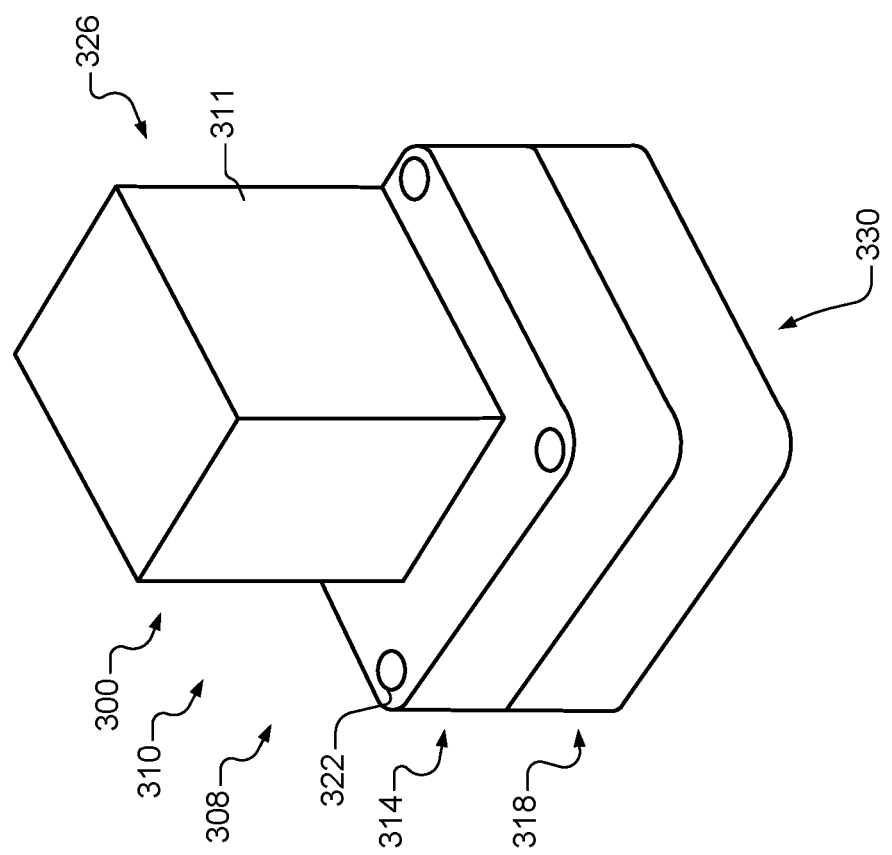

Referring now to FIGS. 3 and 4, a vapor delivery head 300 is shown. In FIG. 3, the vapor delivery head 300 includes a body 308. The body 308 includes a first portion 310 (including an upper portion 311 connected to a flanged lower portion 314) and a second portion 318. As can be appreciated, the vapor delivery head 300 can be implemented with additional or fewer portions.

Fasteners 322 are arranged in bores defined in the flanged lower portion 314 and the second portion 318 to connect the first portion 310 to the second portion 318. The vapor delivery head 300 includes a back side surface 326 and a bottom surface 330.

The back side surface 326 may be connected to an arm, a nozzle head or other supporting structure. The bottom surface 330 is arranged adjacent to and is swept across a top surface of the substrate during processing.

In FIG. 4, the back side surface 326 includes one or more ports 410 and 412 that receive gas mixtures and/or liquid mixtures. In some examples, the ports 410 and 412 include tube gripping portions to engage gas tubes (not shown) connected thereto. The bottom surface 330 defines a vapor containment cavity 450. The vapor containment cavity increases a residence time of the gas mixture adjacent to the substrate and reduces dilution by ambient gases.

In some examples, the vapor containment cavity 450 is bounded by side surfaces and a downwardly facing surface of the second portion 318. In some examples, the vapor containment cavity has a generally rectangular cross section with rounded edges in a plane that is perpendicular to the substrate, although other shapes can be used. In some examples, the vapor containment cavity has a banana-shaped cross section in a plane perpendicular to the substrate, although other shapes can be used.

Through holes 454 pass from an inner plenum (shown below) defined by the vapor delivery head 300 through the bottom surface 330 to supply vapor and/or other gases into the vapor containment cavity 450. While through holes 454 are shown, one or more nozzles or slit-shaped nozzles can be used. Alternately, fluid passages may pass through the body of the vapor delivery head and connect directly to through holes, nozzles or slit-shaped nozzles. In some examples, the through holes 454 have a diameter in a range from 0.1 mm to 2 mm, although other diameters can be used. In some examples, the through holes 454 have a diameter in a range from 0.4 mm to 0.6 mm, although other diameters can be used. In some examples, the vapor containment cavity defines an area covering 0.1% to 30% of the substrate area. Alternatively one or more slit-shaped nozzles can be used.

As will be described further below, the number of through holes 454 and their relative arrangement can be varied. Likewise, a cross-sectional shape of the vapor delivery head 300 and a shape of the vapor containment cavity 450 can be varied. In some examples, the through holes 454 are arranged adjacent to a leading-edge of the vapor delivery head 300 as it is swept across the rotating substrate during processing (with rows of through holes arranged perpendicular to a sweep direction). In some examples, the through holes of the vapor delivery head are cleared from an edge of the substrate when the vapor delivery head is not in use.

Figure 5A:
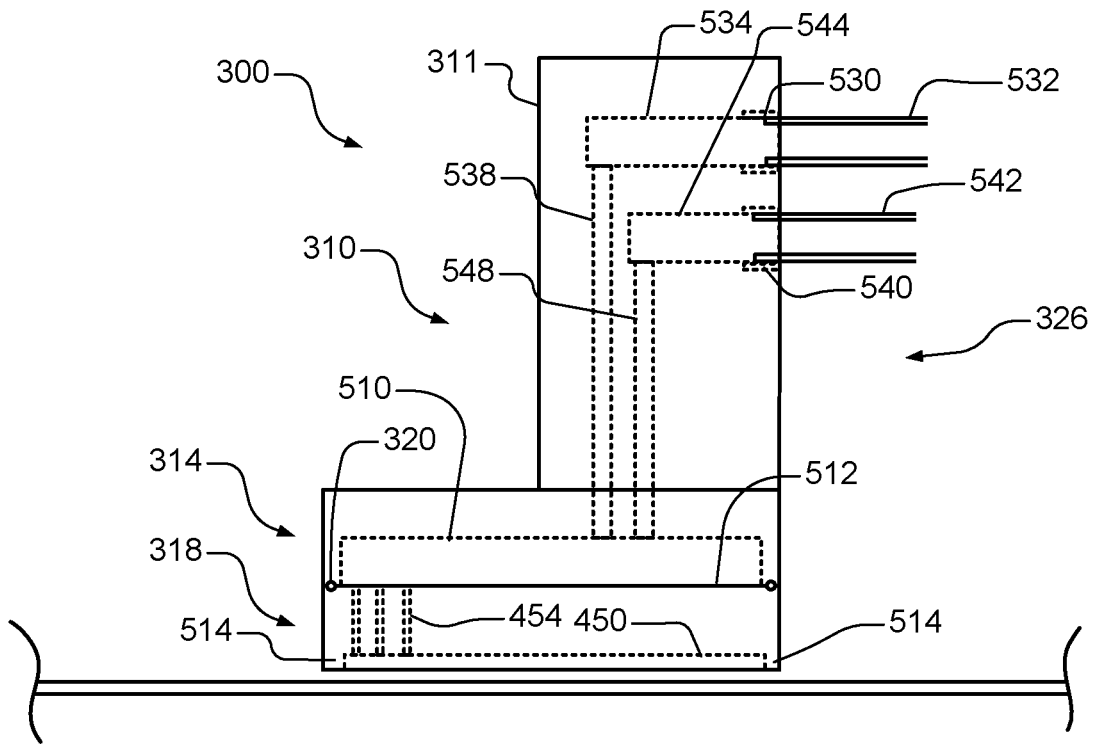
FIGS. 5A and 5B are side cross-sectional and bottom views of an example of a vapor delivery head according to the present disclosure.
Figure 5B:
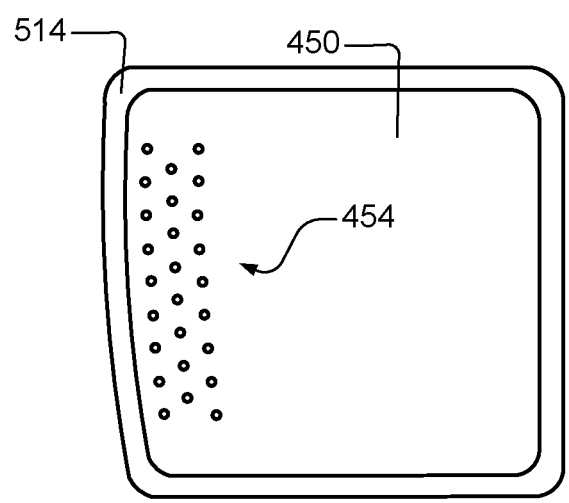

Referring now to FIGS. 5A and 5B, the vapor delivery head 300 defines an internal plenum 510 that is in fluid communication with one end of the through holes 454. The opposite end of the through holes 454 are in fluid communication with the vapor containment cavity 450. In some examples, the internal plenum 510 is defined by a bottom surface of the flanged lower portion 314 and a top surface 512 of the second portion 318. In some examples, a downwardly projecting flange 514 of the second portion 318 surrounds the vapor containment cavity 450 and is maintained a predetermined distance from a top surface of the substrate during etching. In some examples, the predetermined distance is greater than or equal to 0.1 mm and less than or equal to 6 mm, or less than or equal to 5 mm, or less than or equal to 4 mm, or less than or equal to 3 mm, or less than or equal to 2 mm or less than or equal to 1 mm. In some examples, a depth of the vapor containment cavity in a vertical direction is less than or equal to 4 mm, less than or equal to 3 mm, less than or equal to 2 mm or less than or equal to 1 mm. In some examples, the predetermined distance is greater than 0.5 mm. In some examples the depth of the vapor containment cavity is in a range of 0.3 mm and 6 mm.

In some examples, a seal 320 (such as an O-ring arranged in a channel (not shown) formed on the first portion 310 and/or the second portion 318 or a gasket) may be used to provide a seal between the first portion 310 and the second portion 318. In other examples, the first portion 310 and the second portion 318 may be welded together to provide a seal.

A tube gripping element 530 arranged at an opening of a gas flow passage 534 grips an end of a tube 532. In some examples, the gas flow passage 534 is arranged in a horizontal direction. The gas flow passage 534 fluidly connects to a gas flow passage 538. In some examples, the gas flow passage 538 is arranged in a vertical direction. The gas flow passage 538 fluidly connects the gas flow passage 534 to the internal plenum 510.

A tube gripping element 540 arranged at an opening of a gas flow passage 544 grips an end of a tube 542. In some examples, the gas flow passage 544 is arranged in a horizontal direction. The gas flow passage 544 fluidly connects to a gas flow passage 548. In some examples, the gas flow passage 548 is arranged in a vertical direction. The gas flow passage 548 fluidly connects the gas flow passage 544 to the internal plenum 510.

In some examples, the through holes 454 are arranged adjacent to an edge 560 of the vapor delivery head 300. In some examples, the through holes 454 include staggered rows including 9, 8 and 9 through holes 454, although additional or fewer rows and/or through holes can be used. In some examples, the through holes 454 are arranged in an area that is less than or equal to 25% of the area defined by the vapor containment cavity 450. In FIG. 5B, the second portion 318 defines a downwardly-projecting flange 514 around an outer periphery of the bottom surface 330. The downwardly-projecting flange 514 defines an outer periphery of the vapor containment cavity 450.

Figure 6A:
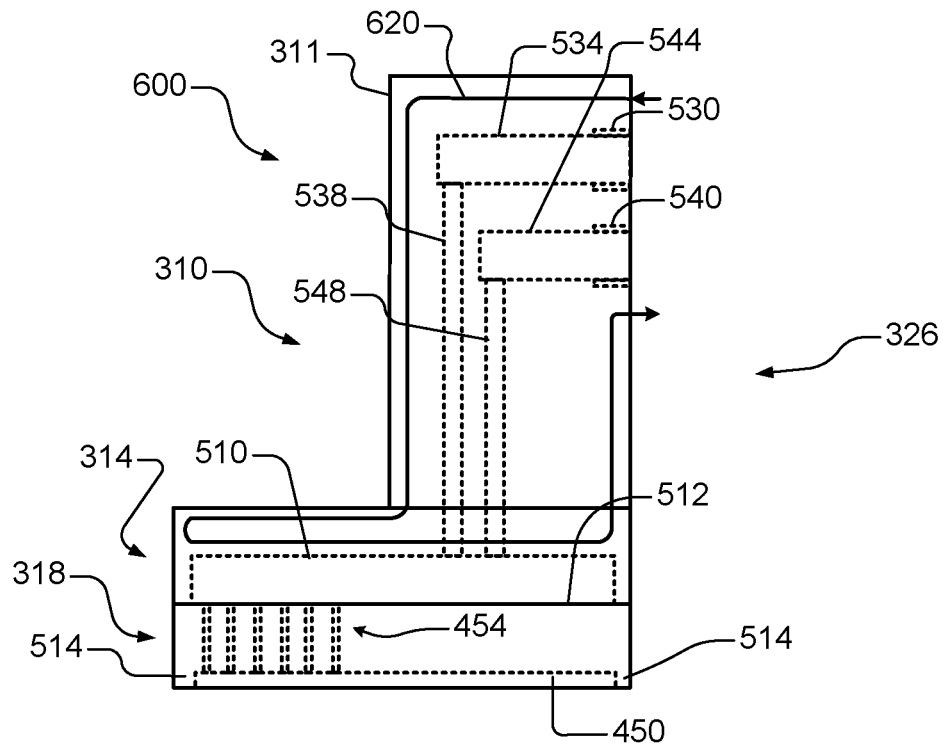
FIGS. 6A and 6B are side cross-sectional and bottom views of another example of a vapor delivery head according to the present disclosure.
Figure 6B:
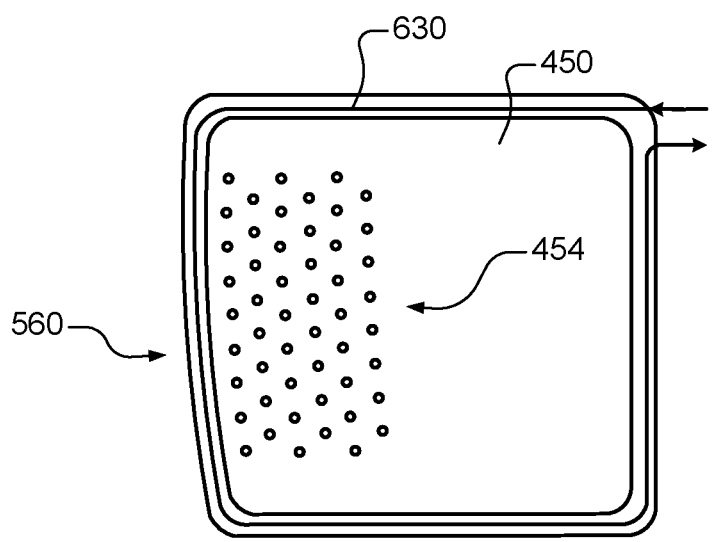

Referring now to FIGS. 6A and 6B, another example of a vapor delivery head 600 according to the present disclosure is shown. Additional rows of through holes 454 are provided. In some examples, the through holes 454 include six staggered rows including 8 or 9 through holes 454, although other arrangements can be used. In some examples, the through holes 454 are arranged in an area that is less than 50% of the vapor containment cavity 450. In some examples, the rows are evenly spaced. In other examples, the spacing monotonically increases or decreases.

In FIG. 6A, a heater 620 defines a path passing through the first portion 310 of the vapor delivery head 600. In FIG. 6B, a heater 630 defines a passage passing through the second portion 318 of the vapor delivery head 600. The heaters 620 and/or 630 may include the resistive or TCR heaters described above and/or the fluid heater described above. One or both of the heaters 620 and 630 may be used to heat the vapor delivery head 600 to a predetermined temperature (with or without local temperature feedback). Use of fluid heaters avoids the need for electrical connections. Temperature control using the heaters 620 and/or 630 may be performed to reduce or eliminate condensation of the gas mixture supplied by the vapor delivery head 600. In some examples, the heaters 620 and/or 630 heat the vapor delivery head in a range from 50° C. to 200° C. or in a range from 50° C. to 100° C.

In some examples, ammonia ($NH_3$), or any amine (e.g. ethyl amine, ethylene diamine, pyrrolidine) is optionally added to the gas mixture when the processing temperature is greater than 100° C. Addition of $NH_3$ works in particular at temperatures above 100° C. where formation of $NH_4F$ is inhibited (as it is above the sublimation temperature) and volatile $(NH_4)_2SiF_6$ is formed.

Figure 7A:
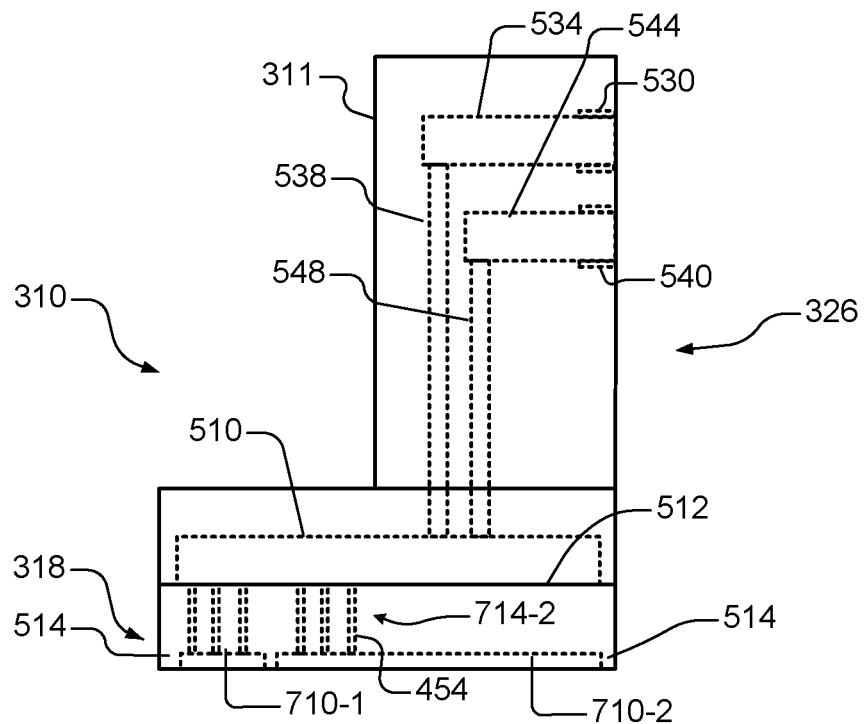
FIGS. 7A and 7B are side cross-sectional and bottom views of another example of a vapor delivery head according to the present disclosure.
Figure 7B:
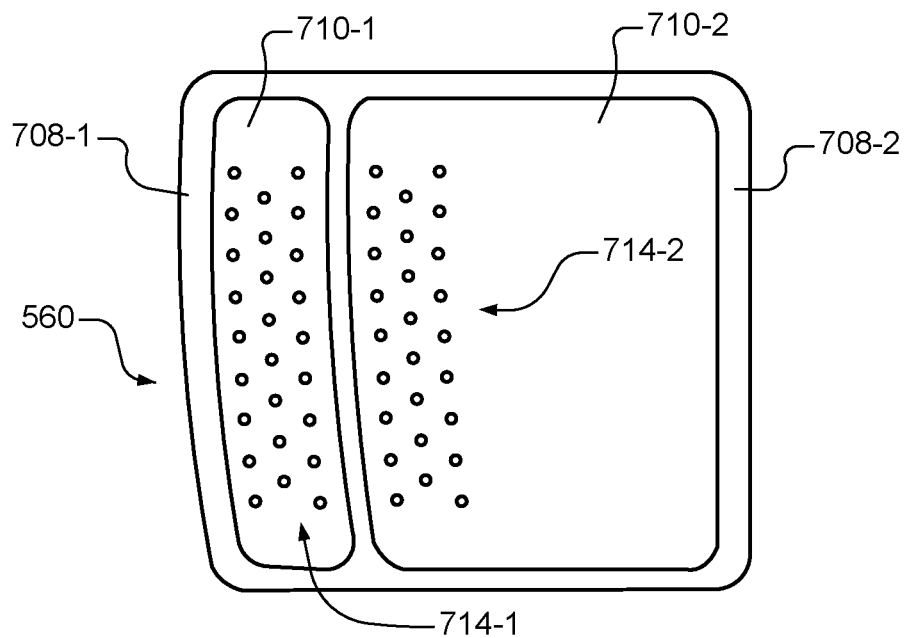

Referring now to FIGS. 7A and 7B, another example of a vapor delivery head 700 according to the present disclosure is shown. The bottom portion 318 includes downwardly-projecting flanges 708-1 and 708-2 sharing a common edge and defining first and second vapor containment cavities 710-1 and 710-2. A first group 714-1 of through holes 454 fluidly connect the internal plenum 510 to the first vapor containment cavity 710-1. A second group 714-2 of through holes 454 fluidly connect the internal plenum 510 to the second vapor containment cavity 710-2. In some examples, the first and second groups 714-1 and 714-2 include three staggered rows including 9, 8 and 9 through holes 454, although other numbers of rows and/or through holes may be used.

Figure 8A:
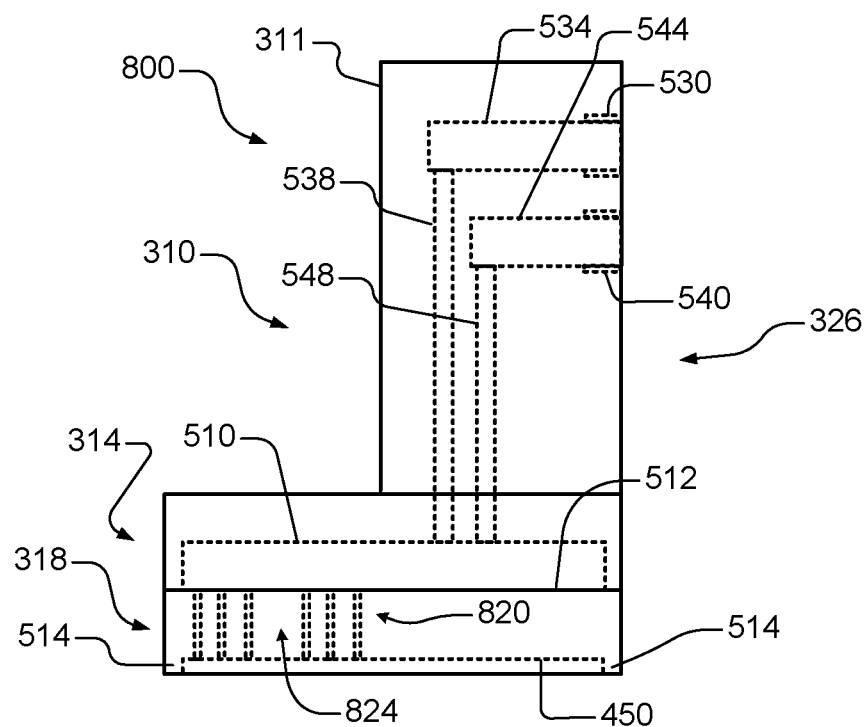
FIGS. 8A and 8B are side cross-sectional and bottom views of another example of a vapor delivery head according to the present disclosure.
Figure 8B:
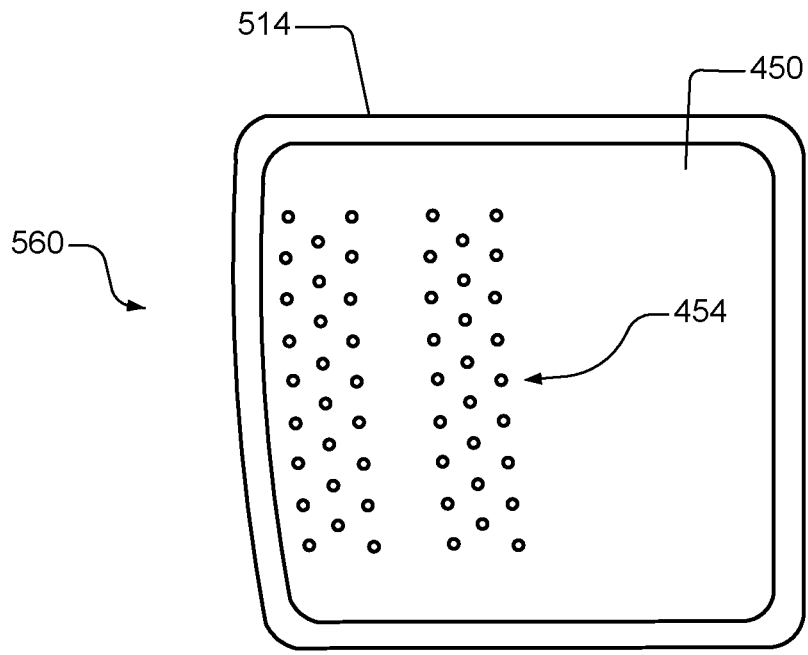

Referring now to FIGS. 8A and 8B, another example of a vapor delivery head 800 is shown. A first group 814-1 of through holes 454 fluidly connects the internal plenum 510 to the vapor containment cavity 450. A second group 814-2 of through holes 454 fluidly connects the internal plenum 510 to the vapor containment cavity 450. In this example, the through holes 454 include irregular spacing between one or more rows of through holes. In some examples, the first and second groups 814-1 and 814-2 include three staggered rows each including 9, 8 and 9 through holes 454, although other numbers of rows and/or through holes may be used. The first and second groups 814-1 and 814-2 of through holes 454 are spaced a distance that is greater than individual row spacing within the first and second groups 814-1 and 814-2 of through holes 454.

Referring now to FIGS. 9A to 9C, a curved vapor delivery head 920 is shown. In FIG. 9A, the curved vapor delivery head 920 is shown relative to an underlying substrate 922. In some examples, a portion 924 of the curved vapor delivery head 920 is arcuate and the vapor containment cavity is generally banana-shaped. In some examples, the portion 924 has the same or similar curvature of a segment of the substrate 922. The curved vapor delivery head 920 can be attached to a nozzle head 930 as in FIG. 2D. The curved vapor delivery head 920 defines a vapor containment cavity 950.

In FIG. 9B, the curved vapor delivery head 920 includes a first portion 934 that is connected to a second portion 936. A plenum 942 is defined between the first portion 934 and the second portion 936. The second portion defines a vapor containment cavity 948. A plurality of through holes 946 connect the plenum 942 to the vapor containment cavity 948.

In FIG. 9C, a spoiler 950 may be arranged along a leading edge of the vapor delivery head 920 to reduce turbulence that may occur with a blunt-shaped leading edge. In some examples, the spoiler 950 has a wedge-like shape configured to disperse air or other ambient gas.

Figure 10A:
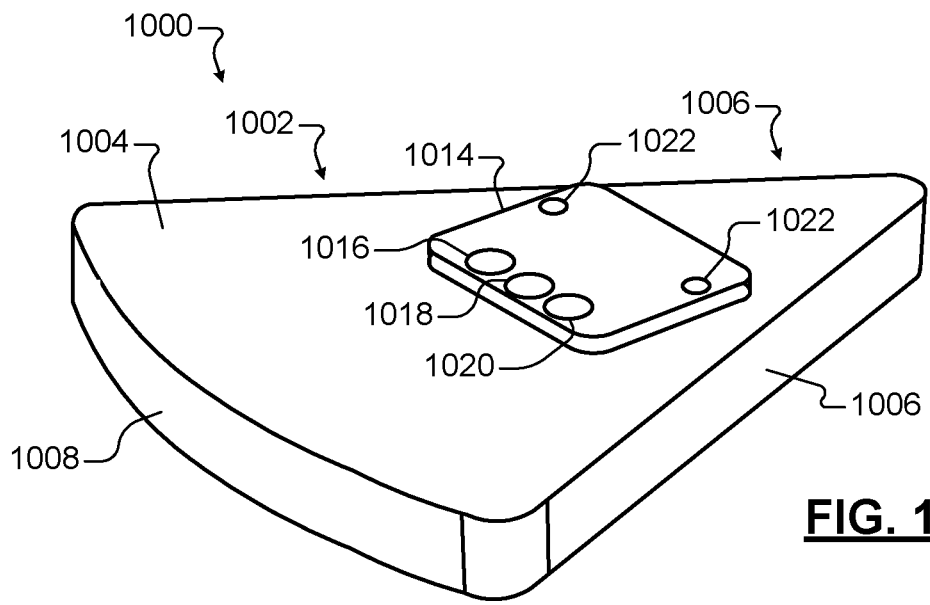
FIG. 10A is a top perspective view of a vapor delivery head according to the present disclosure.
Figure 10B:
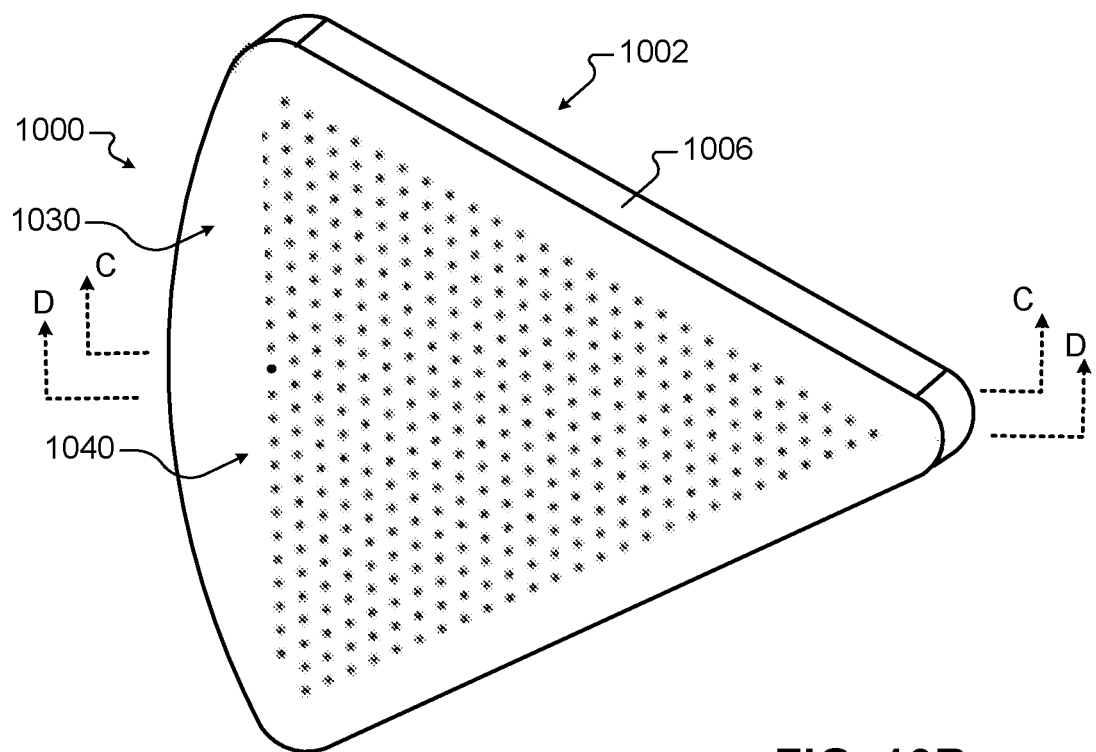
FIG. 10B is a bottom perspective view of a vapor delivery head according to the present disclosure.

Referring now to FIG. 10A to 10H, another example of a vapor delivery head 1000 for delivering a gas mixture to a substrate according to the present disclosure is shown. In FIGS. 10A and 10B, the vapor delivery head 1000 includes a body 1002 with an upper surface 1004, side surfaces 1006 and a side surface 1008. In some examples, the side surfaces 1006 are generally straight segments and the side surface 1008 includes a curved or arcuate segment. In some examples, the angle defined between the side surfaces 1006 is in a range from 30° to 75°. In some examples, an angle defined between the side surfaces 1006 is in a range from 45° to 60°. In some examples, a length of a radial center line of the body is in a range from 70-150%, 80-130%, or 90-120% of a radius of the substrate to be treated.

The vapor delivery head 1000 further includes a mounting pad 1014 arranged on the upper surface 1004. The mounting pad 1014 includes bores 1022 for receiving fasteners to attach a connection fixture (not shown) (for vapor and heated fluid) to the vapor delivery head 1000. The mounting pad 1014 further includes bores 1016, 1018 and 1020. In some examples, the bore 1016 is associated with a heated fluid outlet or inlet, the bore 1018 is associated with a gas mixture inlet, and the bore 1020 is associated with a heated fluid inlet or outlet, respectively.

In some examples, the vapor delivery head 1000 is mounted above the substrate during treatment of the substrate using the gas mixtures described herein. The vapor delivery head 1000 may be removed when other substrate treatments are performed. In some examples, the vapor delivery head 1000 is fixed relative to the rotating substrate. In some examples, the vapor delivery head 1000 is mounted to an arm that moves the vapor delivery head 1000 vertically to provide a predetermined distance between the vapor delivery head 1000 and the substrate. In some examples, the predetermined distance is in a range from 0.3 mm to 5 mm. In some examples, the arm moves the vapor delivery head laterally to provide top access to the substrate for other treatment arms/nozzles. In some examples, the rotary chuck is arranged in a chamber with annular ducts arranged around a radially outer surface of the rotary chuck to collect liquid spun off the substrate during spin treatment.

In some examples, the bore 1018 supplies the gas mixtures described above and the bores 1016 and 1020 supply the heated fluid such as a heated liquid or a heated gas. In some examples, the heated gas includes a heated inert gas such as molecular nitrogen $N_2$, although other types of gases can be used.

In FIG. 10B, a bottom surface 1030 of the body 1002 is shown to include a plurality of through holes 1040 arranged in a bore hole pattern. In some examples, the plurality of through holes 1040 includes 50 to 1000 through holes. In other examples, the plurality of through holes 1040 includes 300 to 500 through holes. In some examples, an outer border of the bore hole pattern is generally triangular-shaped, although other shapes can be used. In some examples, each of the plurality of through holes is also arranged in triangle patterns relative to adjacent through holes within the outer border. As can be appreciated, the through holes can be arranged in other patterns.

As will be described further below, the gas mixture is supplied to the bore 1018 and is dispensed through the plurality of through holes 1040 onto an adjacent exposed surface of the substrate. The heated fluid is supplied to the bore 1020, circulated through the body 1002 (without mixing with the gas mixture) to heat the body 1002 to an elevated temperature and prevent condensation of the vapor in the gas mixture. The heated fluid is returned to the bore 1016 corresponding to the heated fluid outlet.

Figure 10C:
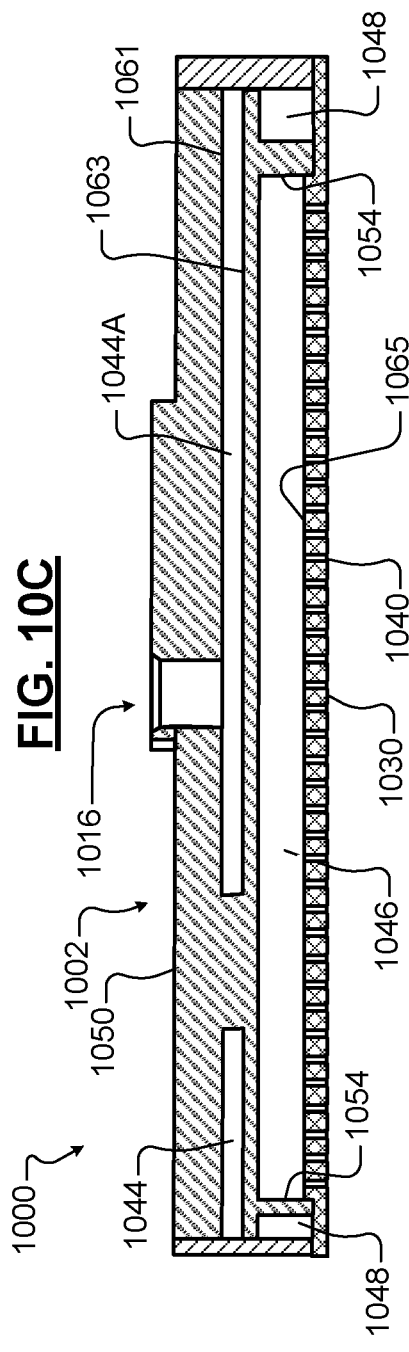
FIG. 10C is a cross-sectional view of the vapor delivery head taken along a radial center line (C-C FIG. 10B) according to the present disclosure.
Figure 10D:
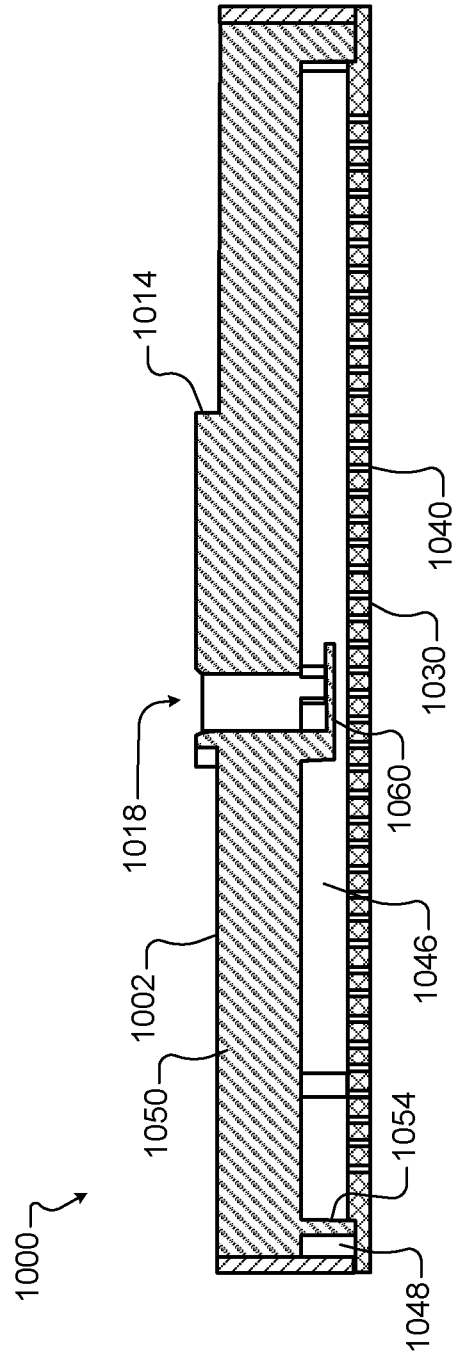
FIG. 10D is a cross-sectional view of the vapor delivery head taken along a line (D-D FIG. 10B) offset from and parallel to the radial center line according to the present disclosure.

Referring now to FIGS. 10C and 10D, an upper portion 1050 of the body 1002 defines a first upper plenum 1044A in fluid communication with the bore 1016 corresponding to the heated fluid inlet. The upper portion 1050 of the body 1002 also defines a second upper plenum 1044B (shown in FIG. 10H) in fluid communication with the bore 1018 corresponding to the heated fluid outlet. The first upper plenum 1044A and the second upper plenum 10446 may be collectively referred to herein as the upper plenum 1044.

The upper plenum 1044 is defined between a horizontal surface 1061 and a horizontal surface 1063 of the body 1002. The lower plenum 1046 is defined by the horizontal surface 1063, side walls 1054 and an upper portion 1065 of the bottom surface 1030 (which includes the plurality of through holes 1040). An outer plenum 1048 is arranged below the upper plenum 1044 and outside of the lower plenum 1046 (between side walls 1054 and side surfaces 1006).

Figure 10E:
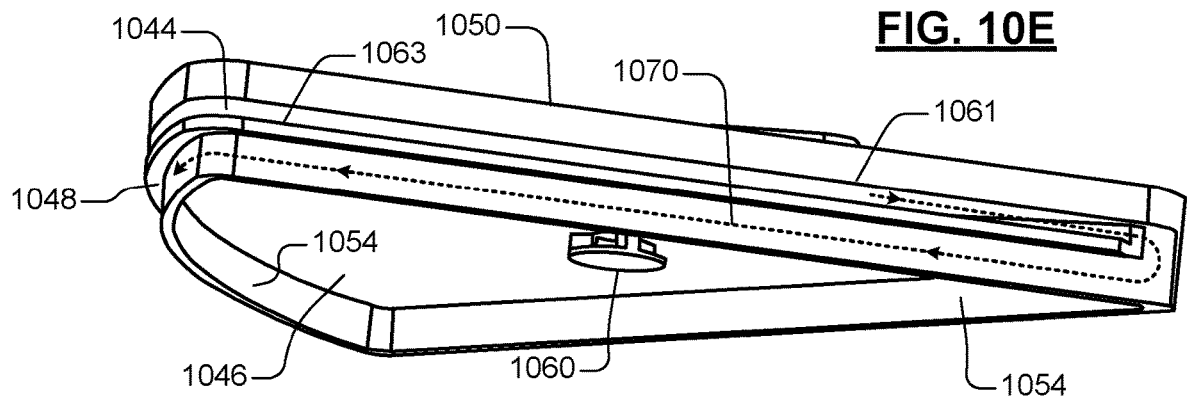
FIG. 10E is a bottom, partial perspective view of the vapor delivery head with a bottom surface removed according to the present disclosure.

Referring now to FIGS. 10C and 10E, heated fluid enters the body 1002 through the bore 1020 and flows into the first upper plenum 1044A. The heated fluid flows from the first upper plenum 1044A downwardly into the outer plenum 1048. The heated fluid then flows through the outer plenum 1048 and upwardly into the second upper plenum 1044B. The heated fluid flows out of the body 1002 through the bore 1016.

In FIG. 10E, a path 1070 of the heated fluid is shown from the first upper plenum 1044A to a location near one side of a junction between side surfaces 1006 of the body 1002. The heated fluid flows downwardly into the outer plenum 1048 and around a periphery of the body 1002 adjacent to and outside of the lower plenum 1046. The heated fluid flows upwardly at a location near another side of the junction between side surfaces 1006 of the body 1002 and into the second upper plenum 1044B.

Distribution of the gas mixture in the lower plenum 1046 is also shown in FIG. 10E. The bore 1018 corresponding to the gas mixture inlet delivers the gas mixture to a baffle 1060. The baffle 1060 distributes the gas mixture in the lower plenum 1046 and avoids high pressure immediately below the bore 1018.

Figure 10F:
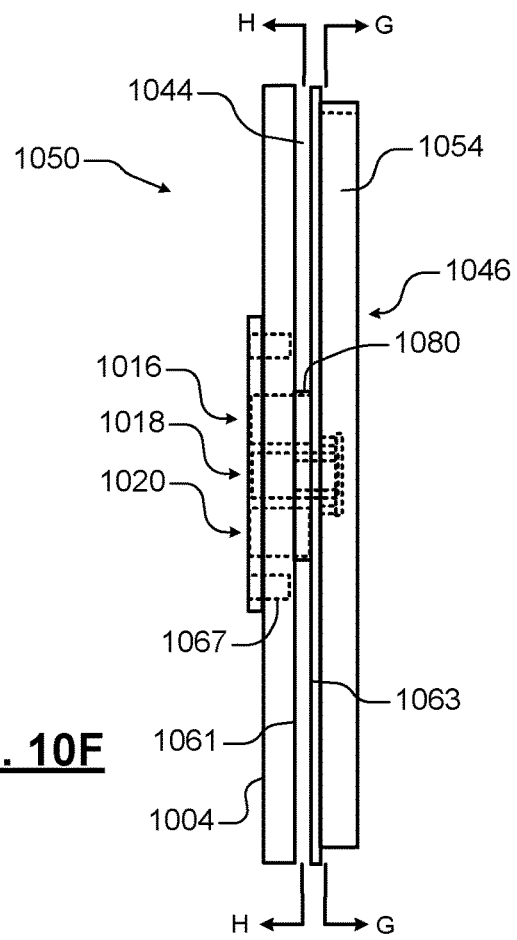
FIG. 10F is a side, partial cross-sectional view of the vapor delivery head taken along a line perpendicular to the radial center line according to the present disclosure.

In FIGS. 10F, 10G and 10H, additional features of the vapor delivery head 1000 are shown. In FIG. 10F, bores 1067 accept fasteners to attach the connection fixture (not shown) to the upper surface 1004 of the vapor delivery head 1000. In FIG. 10G, the baffle 1060 is shown in further detail to include baffle portions 1072-1, 1072-2 and 1072-M (collectively the baffle portions 1072) arranged at 360°/M. In some examples, M=3 and one of the baffle portions (e.g. 1072-2) is arranged on a radial center line in a location distal from a junction between side surfaces 1006. The arrangement of the baffle portions 1072 directs more of the gas mixture towards a larger area of the lower plenum 1046 adjacent to the surface 1008 as compared to a smaller area of the lower plenum 1046 adjacent to a junction of the side surfaces 1006. The baffle 1060 also provides more uniform pressure by reducing high pressure that would otherwise occur immediately below the bore 1018.

In FIG. 10H, a center divider 1080 is arranged between the first upper plenum 1044A and the second upper plenum 1044B to prevent direct flow of heated fluid therebetween. The center divider 1080 includes a middle portion 1084, a first portion 1082 located near the junction between the side surfaces 1006 and a second portion 1086 located adjacent to the side surface 1008. In some examples, the middle portion 1084 is wider (in a direction transverse to the radial center line) than the first portion 1082 and the middle portion 1084. The bores 1016, 1018, and 1020 are arranged between the middle portion 1084 and the first portion 1082. The first portion 1082 includes a first arcuate recessed portion 1092 to direct the heated fluid from the first upper plenum 1044A into the outer plenum 1048. The first portion 1082 includes a second arcuate recessed portion 1094 to direct heated fluid from the outer plenum 1048 into the second upper plenum 1044B.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A vapor delivery head for wet treatment of a substrate comprising:
    a body including an upper surface, a lower surface, an upper plenum and a lower plenum;
    a first bore arranged on the upper surface of the body and fluidly connected to the upper plenum to supply heated fluid;
    a second bore arranged on the upper surface of the body and connected to the upper plenum to remove heated fluid;
    a third bore arranged on the upper surface of the body and connected to the lower plenum to receive a gas mixture;
    a plurality of through holes through the lower surface of the body and in fluid communication with the lower plenum; and
    a baffle arranged in the lower plenum between the third bore and the lower plenum, wherein the baffle includes a plurality of baffle portions to distribute the gas mixture in the lower plenum.

2. The vapor delivery head of claim 1, wherein the body includes a first side, a second side and a third side, wherein the body has a pie shape.

3. The vapor delivery head of claim 2, wherein an angle defined between the first side and the second side is in a range from 30° to 75°.

4. The vapor delivery head of claim 2, wherein an angle defined between the first side and the second side is in a range from 45° to 60°.

5. The vapor delivery head of claim 2, wherein the baffle includes a plurality of baffle portions arranged around an opening into the lower plenum to distribute more of the gas mixture to an area adjacent to the third side as compared to the gas mixture delivered to an area adjacent to a junction of the first side and the second side.

6. The vapor delivery head of claim 5, wherein the plurality of baffle portions includes:
a first baffle portion;
a second baffle portion; and
a third baffle portion,
wherein the first baffle portion, the second baffle portion and the third baffle portion are arranged 120° apart around the opening into the lower plenum and wherein the first baffle portion is located on a radial line of the body closest to the third side.

7. The vapor delivery head of claim 1, wherein a radius of the body is greater than 80% of a radius of the substrate.

8. The vapor delivery head of claim 1, wherein the heated fluid includes a heated gas.

9. The vapor delivery head of claim 1, wherein the plurality of through holes are arranged in an area on the lower surface that is triangular.

10. A vapor delivery head for wet treatment of a substrate, the vapor delivery head comprising:
a body including an upper surface, a lower surface, an upper plenum and a lower plenum;
a first bore arranged on the upper surface of the body and fluidly connected to the upper plenum to supply heated fluid;
a second bore arranged on the upper surface of the body and connected to the upper plenum to remove heated fluid;
a third bore arranged on the upper surface of the body and connected to the lower plenum to receive a gas mixture; and
a plurality of through holes through the lower surface of the body and in fluid communication with the lower plenum,
wherein the body further defines an outer plenum arranged below the upper plenum and outside of the lower plenum.

11. A vapor delivery head for wet treatment of a substrate, the vapor delivery head comprising:
a body including an upper surface, a lower surface, an upper plenum and a lower plenum;
a first bore arranged on the upper surface of the body and fluidly connected to the upper plenum to supply heated fluid;
a second bore arranged on the upper surface of the body and connected to the upper plenum to remove heated fluid;
a third bore arranged on the upper surface of the body and connected to the lower plenum to receive a gas mixture; and
a plurality of through holes through the lower surface of the body and in fluid communication with the lower plenum,
wherein the upper plenum includes a first upper plenum, a second upper plenum and a divider arranged between the first upper plenum and the second upper plenum and further comprising an outer plenum located below the upper plenum and outside of the lower plenum.

12. The vapor delivery head of claim 11, wherein the heated fluid flows into the first bore, into the first upper plenum, into the outer plenum, into the second upper plenum and out through the second bore.

13. A device for wet treatment of a substrate, comprising:
a chuck to hold the substrate and to rotate the substrate; and
the vapor delivery head of claim 1, wherein the lower surface of the body is arranged parallel to the substrate during treatment.

14. A method comprising:
using the device of claim 13 to direct the gas mixture over an upper surface of the substrate, wherein the gas mixture contains hydrogen fluoride.

15. The method of claim 14, further comprising, prior to using the device to direct the gas mixture over a surface of the substrate:
spin rinsing the surface of the substrate using a first rinsing liquid; and
spinning off the first rinsing liquid from the surface of the substrate.

16. The method of claim 15, wherein the hydrogen fluoride is a first reactive component and the gas mixture further contains a second reactive component.

17. The method of claim 16, wherein at least one of:
the second reactive component is a proton acceptor; and/or
the second reactive component includes an OH-group.

18. The method of claim 16, wherein the second reactive component is selected from a group consisting of water vapor, alcohol vapor, ammonia and amine.

* * * * *